United States Patent
Michalski

(10) Patent No.: US 10,264,691 B2
(45) Date of Patent: Apr. 16, 2019

(54) FIELD DEVICE FOR AUTOMATION TECHNOLOGY

(71) Applicant: Endress+Hauser GmbH+Co. KG, Maulburg (DE)

(72) Inventor: Bernhard Michalski, Maulburg (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 0 days.

(21) Appl. No.: 15/554,564

(22) PCT Filed: Feb. 12, 2016

(86) PCT No.: PCT/EP2016/053039
§ 371 (c)(1),
(2) Date: Aug. 30, 2017

(87) PCT Pub. No.: WO2016/139049
PCT Pub. Date: Sep. 9, 2016

(65) Prior Publication Data
US 2018/0077811 A1  Mar. 15, 2018

(30) Foreign Application Priority Data
Mar. 2, 2015 (DE) .................. 10 2015 102 947

(51) Int. Cl.
*H01H 36/00* (2006.01)
*H05K 5/02* (2006.01)
(Continued)

(52) U.S. Cl.
CPC ............. *H05K 5/0247* (2013.01); *G01D 5/06* (2013.01); *G01D 5/2515* (2013.01);
(Continued)

(58) Field of Classification Search
CPC ........... H01H 5/02; H01H 36/00–36/36; H01F 2007/185; H01F 7/0236
(Continued)

(56) References Cited

U.S. PATENT DOCUMENTS 3,680,026 A  7/1972 Masuda et al.
3,815,066 A *  6/1974 Vinal ..................... H03K 17/90
200/404

(Continued)

FOREIGN PATENT DOCUMENTS

DE  102008058538 A1  5/2010
DE  102010033014 A1  2/2012
(Continued)

OTHER PUBLICATIONS

Search Report for German Patent Application No. 10 2015 102 947.2, German Patent Office, dated Feb. 8, 2016, 8 pp.
(Continued)

*Primary Examiner* — Ramon M Barrera
(74) *Attorney, Agent, or Firm* — Mark A. Logan; PatServe

(57) ABSTRACT

The invention relates to a field device for automation engineering having a housing, wherein the housing has at least one associated pushbutton switch. Operation of the pushbutton switch is detected, according to the invention, inside the housing without the presence of mechanical or electrical passageway through the wall of the housing. For this, the housing does not need to have a blind hole or an inwardly directed depression. This is achieved by a rigid arrangement of a first element for producing a magnetic field on the outer wall of the housing. By means of interaction with a second element for influencing the magnetic field of the first element, which is arranged in an operating element, a variable magnetic field is produced inside the housing.
(Continued)

This magnetic field is sensed by a sensor. On the basis of the alteration in the magnetic field, the sensor can determine whether the pushbutton switch is currently being operated.

12 Claims, 5 Drawing Sheets

(51) Int. Cl.
H01F 7/02 (2006.01)
H01H 36/02 (2006.01)
G01D 5/06 (2006.01)
G01D 5/251 (2006.01)
G01D 11/24 (2006.01)
G01R 33/00 (2006.01)
H05K 5/00 (2006.01)
H01F 7/18 (2006.01)

(52) U.S. Cl.
CPC ....... *G01D 11/245* (2013.01); *G01R 33/0023* (2013.01); *G01R 33/0047* (2013.01); *G01R 33/0088* (2013.01); *H01F 7/0236* (2013.01); *H01H 36/00* (2013.01); *H01H 36/0073* (2013.01); *H01H 36/02* (2013.01); *H05K 5/0091* (2013.01); *H01F 2007/185* (2013.01)

(58) Field of Classification Search
USPC .................................................. 335/205–207
See application file for complete search history.

(56) References Cited

U.S. PATENT DOCUMENTS 3,858,145 A * 12/1974 Sulich .................. H01F 7/0252
335/205
2010/0156396 A1 6/2010 Moroni et al.
2015/0091679 A1* 4/2015 Bachmann ............ H01H 13/14
335/205

FOREIGN PATENT DOCUMENTS

EP 2018296 B1 11/2011
EP 2535687 A2 12/2012
WO 2006024189 A1 3/2006

OTHER PUBLICATIONS

Search Report for International Patent Application No. PCT/EP2016/053039, WIPO, dated Apr. 15, 2016, 12 pp.

* cited by examiner

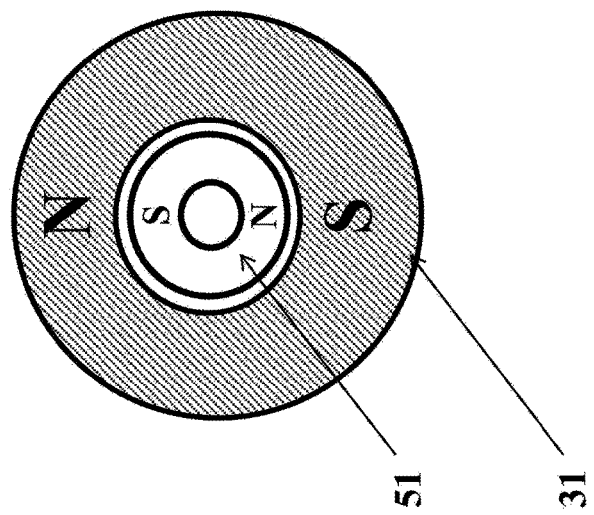
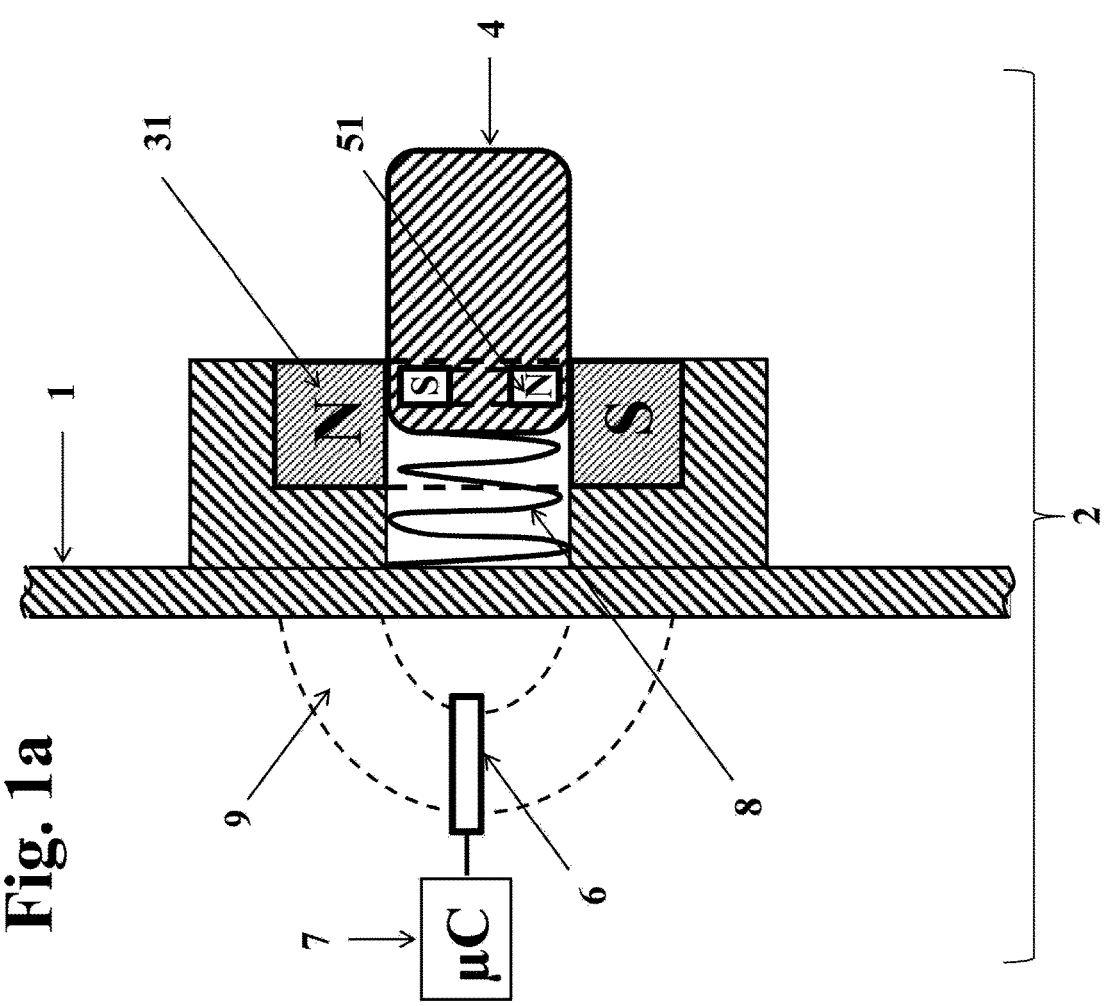
Fig. 1b
Fig. 1a

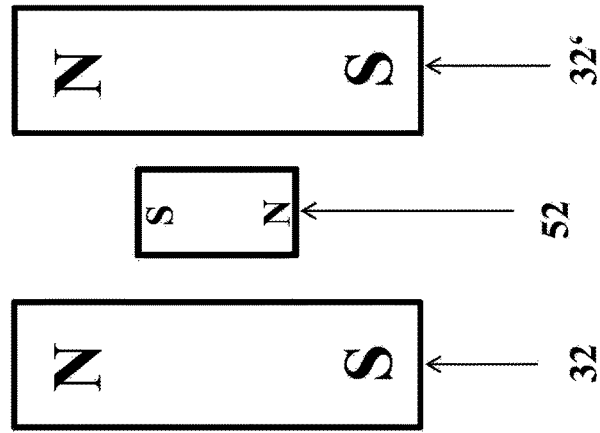
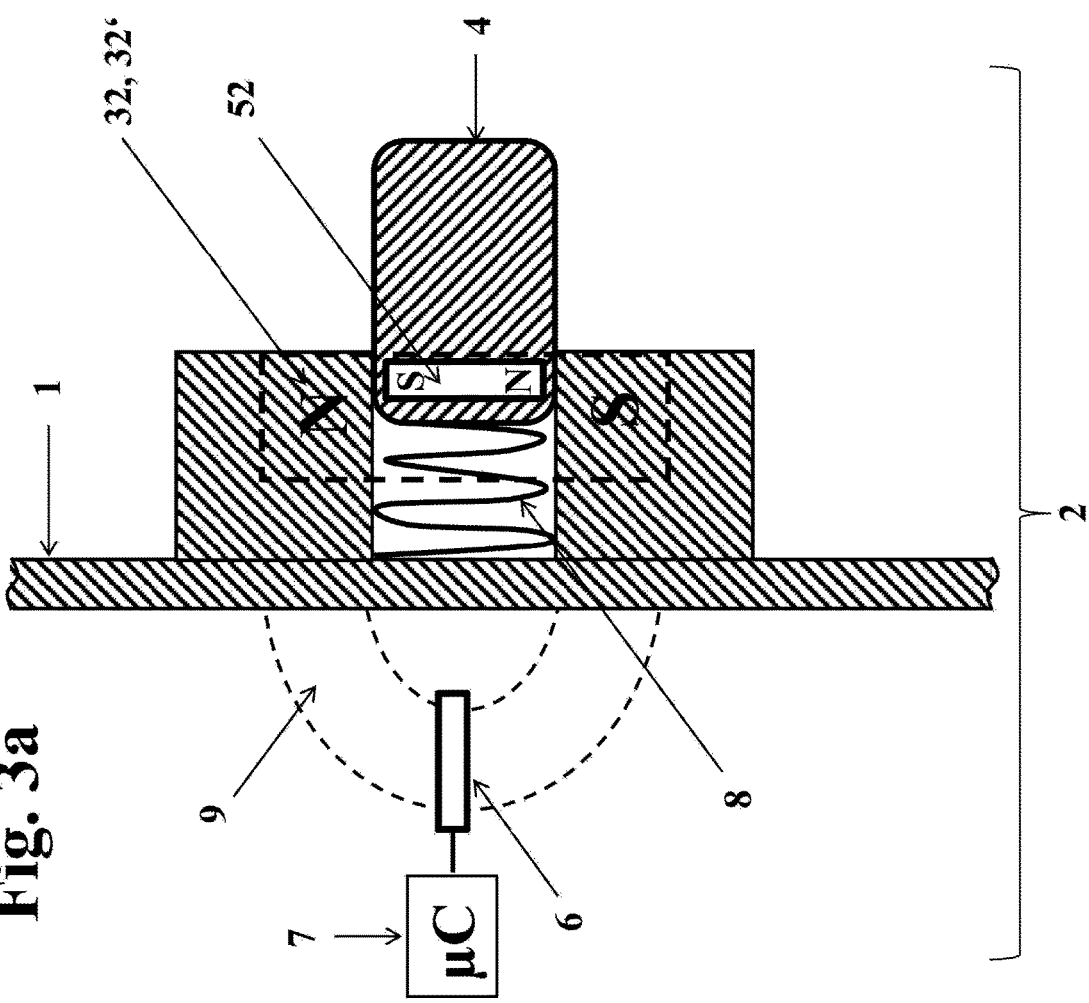

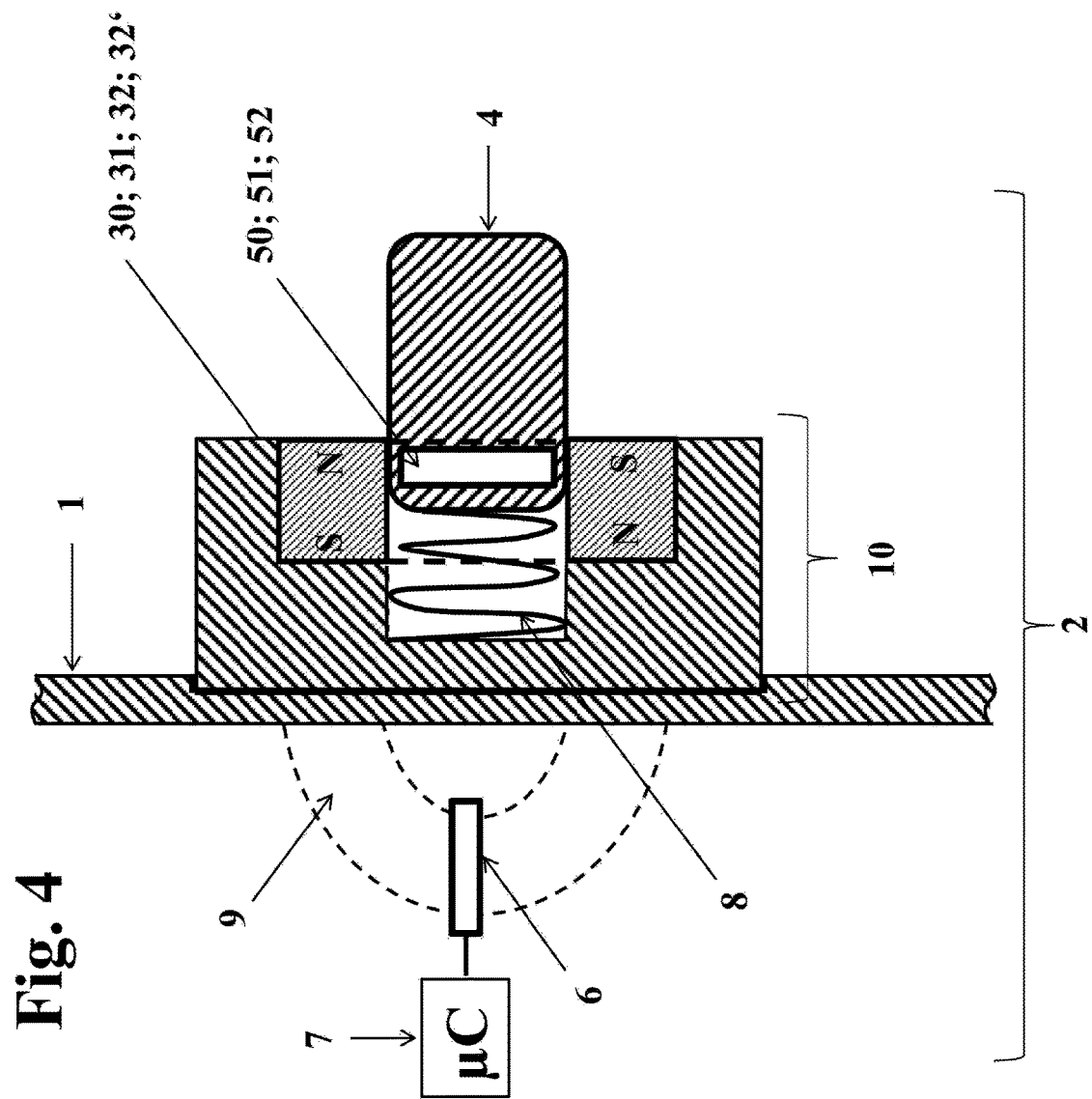

FIELD DEVICE FOR AUTOMATION TECHNOLOGY

CROSS-REFERENCE TO RELATED APPLICATIONS

The present application is related to and claims the priority benefit of German Patent Application No. 10 2015 102 947.2, filed on Mar. 2, 2015 and International Patent Application No. PCT/EP2016/053039, filed on Feb. 12, 2016 the entire contents of which are incorporated herein by reference.

TECHNICAL FIELD

The invention relates to a field device of automation technology with a housing, wherein the housing has at least one pushbutton switch.

BACKGROUND

In automation technology, especially in process automation technology, field devices are often applied, which serve for registering and/or influencing process variables. Serving for registering process variables are sensors, which are integrated, for example, into fill level measurement devices, flow measuring devices, pressure- and temperature measuring devices, pH-redox potential measuring devices, conductivity measuring devices, etc., and which register the corresponding process variables, fill level, flow, pressure, temperature, pH-value, redox potential, and conductivity, respectively. Serving for influencing process variables are actuators, such as, for example, valves or pumps, via which the flow of a liquid in a pipeline section, or the fill level in a container, can be changed. Referred to as field devices are, in principle, all devices, which are applied near to the process and which deliver, or process, process relevant information. In connection with the invention, understood to be field devices are thus also remote I/Os, radio adapters, and, generally, electronic components, which are arranged at the field level. A large number of such field devices are produced and sold by the firm, Endress+Hauser.

A frequently required criterion for field devices is explosion protection, since field devices are often applied in explosion-endangered regions. Accordingly, they must be designed in accordance with pertinent explosion protection standards. These are established, for example in Europe, by the family of standards, EN 60079. Especially, these standards relate to the housings of the different field device types, since the character of the housing decisively influences the explosion protection properties of the field device. In order to conform to the standards, it is, among other things, advantageous, when the housing has an as closed as possible form of construction. Under this point of view, electrical and mechanical cable passageways through the housing-wall, for example, for electrical contacting or for information exchange, represent a major concern. As a result, it makes sense to design the structure, as much as possible, so as to avoid these cable passageways.

Corresponding structural specifications are, however, difficult to put into practice, when, for example, the serviceability of field devices by service personnel is considered. Thus, often, interfaces must be present for read-out of data, for configuring the device and for inputting parameters. Besides graphic display, this means also input elements on the housing outer surface, such as, among other things, pushbutton switches.

Known from the state of the art are pushbutton switches, via which an information input into the housing interior of field devices can be performed without electrical or mechanical passageway.

Thus, in U.S. Pat. No. 5,353,200, a housing for a field device is provided, in the case of which the information input occurs via one or more pushbutton switches. In such case, the housing exterior is embodied as an at least partially elastic layer, which in the case of contact at the appropriate location actuates a pushbutton switch located in the housing. This variant of embodiment offers very favorable conditions, especially as regards electromagnetic compatibility, also known as EMC. However, a non-solid embodiment of the housing exterior is unsuitable from an explosion protection point of view, since it cannot assure a sufficient defense.

In contrast therewith, magnetic switches offer the opportunity of information input through a solid housing wall, without requiring a passageway or an elastic portion in the housing wall. Thus, for example, buttons with integrated magnet bodies can be used, which are positioned and movable in defined manner with reference to the housing, in order to actuate a Hall-sensor in the interior of the housing by means of a magnetic field.

Offenlegungsschrift DE102004036324A1 discloses a pushbutton switch for a measurement transmitter, in the case of which a support body, which contains a magnet body in asymmetric position, can be inserted in different orientations in a blind hole, wherein the blind hole is directed toward the interior. Depending on orientation of the magnet body in the blind hole, a Hall sensor in the interior of the housing is variably influenced by the magnet body. Via the the particular orientation of the magnet body, either of two manners of operation of the measurement transmitter can be selected.

European Patent EP 0383 823 B1 discloses a measurement transmitter, in the case of which the zero-point and the slope can be set by means of magnetic switches. The magnetic switches have, in each case, a magnet, which is movable in a blind hole, in order to actuate a reed-contact, which is arranged on the housing-interior side of the blind hole.

Common to the described magnet switches is that the housing must have an inwardly directed, blind hole, in order to be able to function. At the same time, a comparatively large pushbutton stroke is required, in order unequivocally to be able to identify the pressed-state. In this way, a sufficiently large dimensioning of the interior as well as a rather constrained arrangement of the magnetic switch located in the housing interior are required. These requirements affect the compactness of the field device negatively. Moreover, it becomes difficult to offer platform designs of different field devices based on the same housing-type.

SUMMARY

An object of the invention, therefore, is to provide a field device with a housing and, located on the housing, at least one pushbutton switch, whose actuation can be detected in the housing interior, wherein the arrangement of the pushbutton switch should be achieved with constructively as simple as possible measures and without mechanical or electrical passageway through the housing wall.

The invention achieves this object by a field device of automation technology with a housing, wherein the housing has at least one pushbutton switch. The field device comprises:

a first element arranged rigidly on the housing for producing a magnetic field;

located on the outer surface of a wall of the housing, an actuating element, which is arranged movably relative to the first element, and which can assume at least a home position and a switching position, wherein the actuating element includes a second element for influencing the magnetic field of the first element;

a sensor located in the interior of the housing for registering at least one component of the magnetic field reigning in the sensor, wherein the sensor transduces the registered component of the reigning magnetic field into an electrical measurement signal; and an electronics unit, which, based on the electrical measurement signal, determines whether the actuating element is located in the home position or in the switching position.

The terminology, field device, means, as already mentioned above, in reference to the invention, any device, which can be applied near to the process and deliver, or process, process relevant information.

As a result of the shiftable arrangement of the first element relative to the second element, an option is provided to control the magnetic field produced by the two elements in the interior of the housing in such a manner that the magnetic field strength strongly varies at the site of the sensor, depending on the position of the actuating element. For this, neither of the two elements can be located in the immediate vicinity of the sensor. In such case, it is advantageous, when the housing is not composed of a ferromagnetic material, so that the magnetic field produced by the first element and by the second element is not influenced by the material of the housing wall. As a result of this, the locating of the actuating element in a blind hole is not absolutely required. This distinguishes the invention from the solutions mentioned in the state of the art. The magnetic switches described in the state of the art function according to the principle of proximity switches. In such cases, it is required that the magnetic element in the switching position or the home position is located in the immediate vicinity of the sensor, while the magnetic element must otherwise have a certain minimum separation. These requirements have long meant that the actuating element needed to be arranged in a blind hole.

An advantageous form of embodiment provides that the sensor is a Hall sensor or a GMR sensor. Both types are semiconductor-based, magnetic field sensors with, in given cases, integrated preprocessing of the signal. The electromechanical element can also be a reed-switch. In this way, the sensor, correspondingly standardized, can be connected to the electronic circuit of the field device. In principle, any type of sensor can be used, which is influenced by the strength of the magnetic field or a vector component thereof.

Additionally, it is advantageous that the direction of movement of the actuating element extends essentially perpendicularly to the wall of the housing. This is preferred for the best operability of the pushbutton switch.

A variant of the embodiment provides that a spring element is placed in such a manner relative to the actuating element that the actuating element is located in the home position in the absence of external force, and that the actuating element shifts into the switching position in the case of external force. In such case, the location of the home position is defined by structural measures, for instance, by stop elements at corresponding locations of the actuating element and the housing. However, the location of the switching position can also be constructively influenced by other stop elements. Such stop elements are, however, not shown in the appended figures for reasons of perspicuity.

In an alternative to the latter embodiments, the first element and the second element are arranged in such a manner relative to the actuating element that the actuating element is held in the home position by the magnetic field reigning in the second element, and that the actuating element shifts in the case of external force into the switching position. This permits an implementing of the pushbutton switch without spring element. The required return force, which locates the actuating element in the home position in the absence of external actuation, is, in this case, introduced exclusively by the reigning magnetic field, which acts on the first element. Also here, the locations of the home position as well as the switching position can be influenced by appropriately embodied stop elements.

An advantageous embodiment provides that the first element is a first ring magnet with diametral poling, wherein the second element is a non-magnetized cylinder of para- or ferromagnetic material with essentially round cross section. Furthermore, the pushbutton switch in this embodiment is embodied in such a manner that the cylinder is arranged essentially concentrically and axially shiftably relative to the first ring magnet. In the case of this embodiment, the first ring magnet produces a magnetic field. Depending on the position of the cylinder relative to the ring magnet, the cylinder amplifies or weakens the magnetic field applied to the sensor.

In an alternative form of embodiment, the first element is a second ring magnet with diametral poling. The second element is a third ring magnet with diametral poling. In such case, the pushbutton switch is embodied in such a manner that the third ring magnet is arranged essentially concentrically and axially shiftably relative to the second ring magnet, and that the poling of the third ring magnet is opposite to the poling of the second ring magnet. In this form of embodiment, the second ring magnet produces a magnetic field. The component of the magnetic field produced by the third ring magnet superimposes on the magnetic field component of the first ring magnet. In this way, depending on the position of the third ring magnet relative to the first ring magnet, the magnetic field applied to the sensor is strengthened or weakened. In the extreme case, it can even be reversed.

In an embodiment additional to the two above mentioned variants, the first element is a parallel arrangement of a first rod magnet and a second rod magnet, whose poling extends with equal sense. The second element is a third rod magnet. The pushbutton switch in this embodiment is embodied in such a manner that the third rod magnet is arranged essentially parallel and shiftably relative to the first rod magnet and the second rod magnet. The poling of the third rod magnet is opposite to the poling of the first rod magnet as well as of the second rod magnet. This arrangement works, in such case, the same as in the previous two alternatives.

In a preferred form of embodiment, the first element is composed of a ferromagnetic material, preferably aluminum-nickel-cobalt, neodynium-iron-boron or hard ferrite. The second element, to the extent that it involves the third ring magnet or the third rod magnet, is composed of a ferromagnetic material, preferably aluminum-nickel-cobalt, neodynium-iron-boron or hard ferrite. Or the second element, to the extent that it involves the non-magnetized cylinder, is composed of an iron-, nickel- or cobalt-alloy. This mentions only preferred magnetic materials. Alternative magnetic materials, from which the first or the second element can be made, can likewise be considered.

A further development of the field device provides that the sensor is surrounded by a flux guide, which is composed of a non-magnetized, para- or ferromagnetic material. In this case, the flux guide is embodied in such a manner that the magnetic fields/field emanating from the first element and/or from the second element toward the sensor is/are strengthened. By this measure, a higher switching threshold can be set at the sensor, in order to effect an improved differentiation between home position and switching position.

Additionally, it is advantageous, when the housing is explosion protection conformly designed. In this way, the field device achieves the necessary capability for use in explosion-endangered regions. In the case of the particular area of application, the appropriate standards must be met, such as, for example, the family of standards EN 60079 for Europe.

An advantageous further development of the invention provides that the first element and the actuating element and, to the extent that the spring element is present, the spring element are arranged on a subcomponent of the housing, wherein the subcomponent has a solid and releasable connection to the housing. The connection can be a screwed connection, or, however, also a plugged connection. This further development enables the components of the pushbutton switch located outwardly on the housing, when required, to be removed, replaced or remounted. Thus, the housing can be used as platform for different field device types, in the case of which, depending on type, it is not compulsory that an interaction occurs externally via pushbutton switch.

A further development of the field device as described in one or more of the above paragraphs provides on the housing a keypad composed of a plurality of such pushbutton switches, wherein the plurality of such pushbutton switches are arranged in a row or as an array. According to the invention, it is, however, also possible to use any kind of arrangement of pushbutton switches. In this way, an improved information input is enabled, for example, for configuring a large number of parameters or for navigation in complex menu structures.

BRIEF DESCRIPTION OF THE DRAWINGS

The invention will now be explained based on the appended drawing, the figures of which show as follows:

FIG. 1a shows a sectional view of a variant of a pushbutton switch 2 on a housing 1 of a field device of the invention, FIG. 1b shows a plan view onto a second ring magnet 31 and a third ring magnet 51 of the variant of the pushbutton switch 2 of the field device of the invention illustrated in FIG. 1a, FIG. 2a shows a sectional view of an additional variant of the pushbutton switch 2 on the housing 1 of the field device of the invention, FIG. 3b shows a plan view onto a first rod magnet 32, a second rod magnet 32' and a third rod magnet 52 of the variant of the pushbutton switch 2 of the field device of the invention illustrated in FIG. 3a, FIG. 4 shows a sectional view of a fourth variant of the pushbutton switch 2 with a subcomponent 10 on the housing 1 of the field device of the invention.

DETAILED DESCRIPTION

Figure 2A:
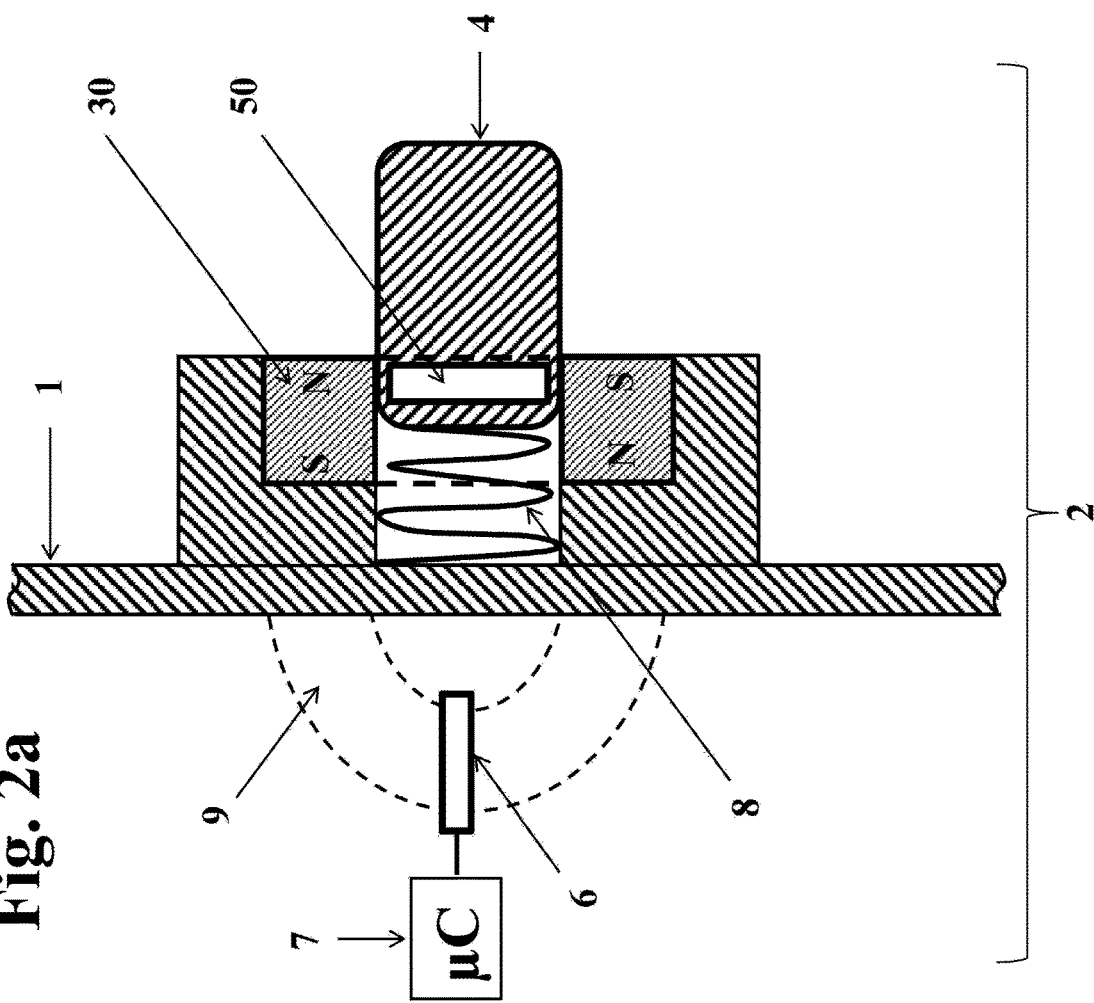
FIG. 2b shows a plan view onto a first ring magnet 30 and a cylinder 50 of the variant of the pushbutton switch 2 of the field device of the invention illustrated in FIG. 2a, FIG. 3a shows a sectional view of a third variant of the pushbutton switch 2 on the housing 1 of the field device of the invention.

FIGS. 1a and 1b show an embodiment of the pushbutton switch 2 on a housing 1 of a field device of the invention. As described above, the field device can be any device, which can be applied near to a process and which delivers, or processes, process relevant information. The pushbutton switch 2 shown in FIG. 1a is located in the home position, which it assumes due to the action of a spring element 8.

In this embodiment, as shown in FIGS. 1a and 1b, a first element 30, 31, 32, 32' is embodied as a diametrally poled, second ring magnet 31. In the case of a second element 50, 51, 52, it is likewise a diametrally poled, third ring magnet 51. An actuating element 4 is arranged in such a manner relative to the second ring magnet 31 that the third ring magnet 51 is located concentrically with the second ring magnet 31 and in the case of actuating of the actuating element 4 shifts axially relative to the second ring magnet 31 toward the housing 1. In such case, the polarities of the two ring magnets 51, 31 are opposite to one another and the movement direction of the actuating element 4 is perpendicular to the surface of the housing 1. The return force for returning the actuating element 4 into the home position is provided by the spring element 8, which is located between the wall of the housing 1 and the actuating element 4. Located in the interior of the housing 1 is a sensor 6 for registering the magnetic field reigning there. In order to transmit the magnetic field from the two ring magnets 31, 51 to the sensor 6 with low loss, there is located around the sensor 6 a flux guide 9 extending toward the inner surface of the wall of the housing 1. Sensor 6 is connected with an electronics unit 7, which, based on the electrical measurement signal of the sensor 6, determines whether the actuating element 4 is located in the home position or in the switching position.

Figure 2B:
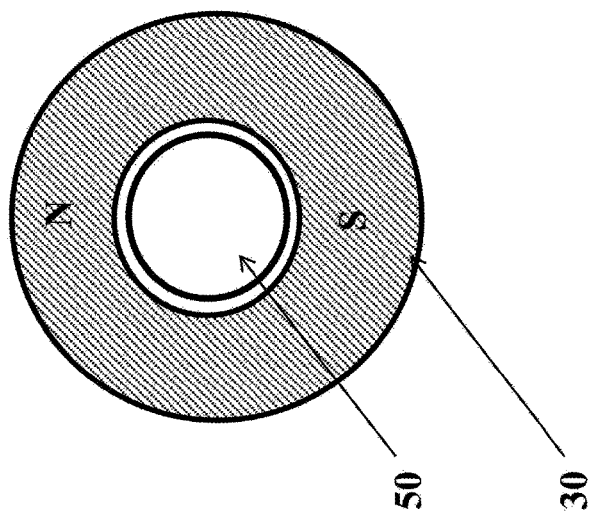

Shown in FIGS. 2a and 2b is another embodiment of the pushbutton switch 2 of the invention. The embodiment shown in the variant of these figures differs from that illustrated in FIGS. 1a and 1b by the feature that the second element 50, 51, 52 is present as a non-magnetized cylinder 50 of para- or ferromagnetic material with, for instance, a round cross section. Thus, the cylinder 50 changes the field produced by the ring magnet 30 as a function of current position of the actuating element 4. This change is, in turn, perceived by the sensor 6. The first ring magnet 30 is in this embodiment not only diametrally poled, but also the poling extends, supplementally, diagonally in comparison with the second ring magnet 31.

FIGS. 3a and 3b illustrate a third form of embodiment of the invention. This form of embodiment differs from the form of embodiment illustrated in FIGS. 1a and 1b, again, in the embodiment of the first element 30, 31, 32, 32' and the second element 50, 51, 52. Here, the first element 30, 31, 32, 32' is implemented as a parallel arrangement of a first rod magnet 32 and a second rod magnet 32', wherein the poling of the two rod magnet 32, 32' extends with the same sense. The second element 50, 51, 52 is embodied as a third rod magnet 52, which is arranged in such a manner in the actuating element 4 that the third rod magnet 52 is, for instance, parallel to the first rod magnet 32 as well as also to the second rod magnet 32'. The poling of the third rod magnet 52 is, in such case, opposite to the poling of the first rod magnet 32 and the second rod magnet 32'.

FIG. 4 shows another embodiment differing from the embodiment illustrated in FIGS. 1a and 1b by the feature that the first element 30; 31; 32; 32', the actuating element 4 and the spring element 8 are arranged on a subcomponent 10 having a solid and releasable connection to the housing 1. Possible securement components for securing the subcomponent 10 to the housing 1 in FIG. 4 include, for example, screw connections or engagement connections such as snap-in structures (not shown).

Figure 5:
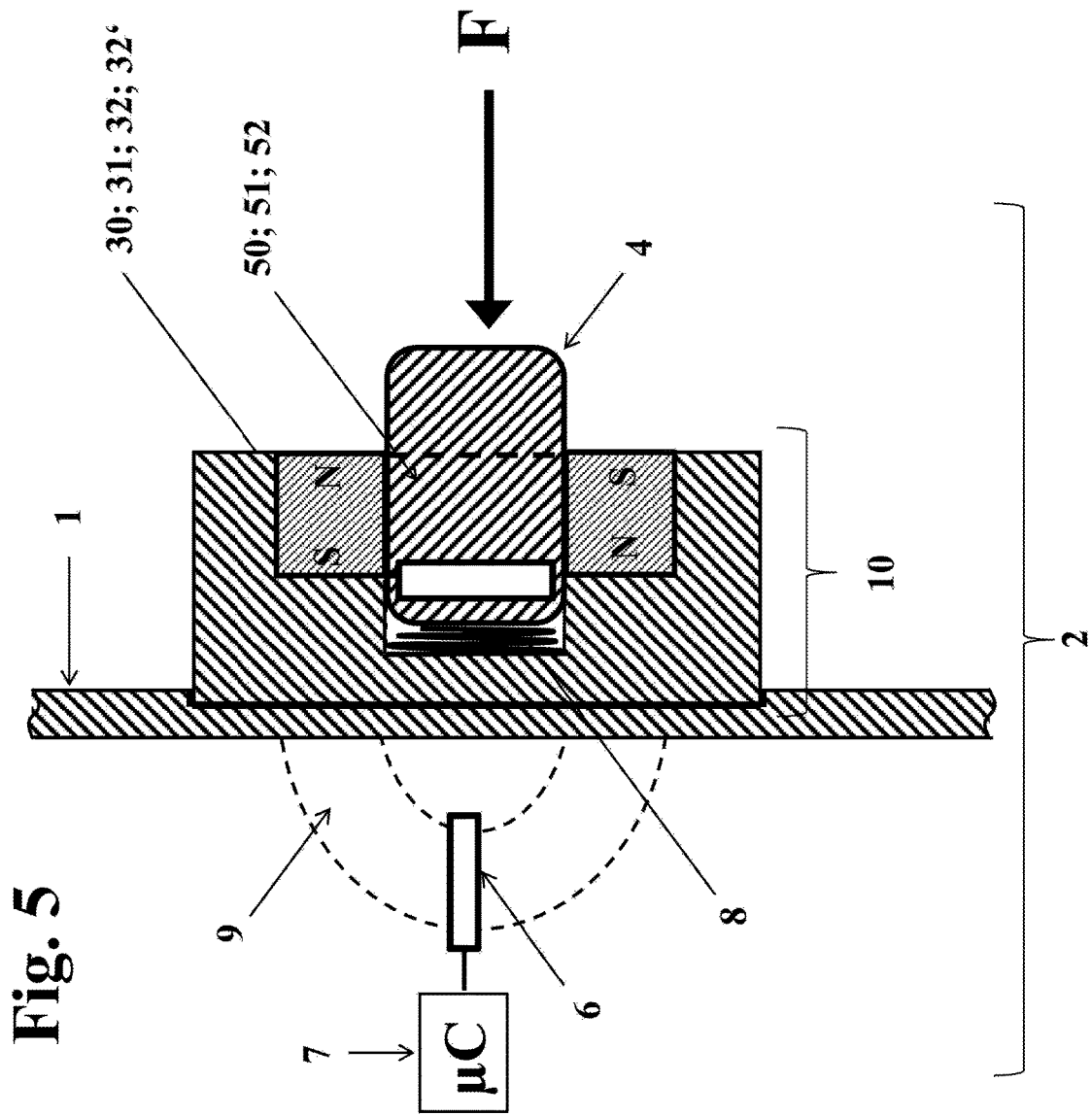
FIG. 5 shows a sectional view of a fourth variant of the pushbutton switch 2 with a subcomponent 10 on the housing 1 of the field device of the invention in the switching position.

In the embodiments shown in FIGS. 1a to 4, the actuating element 4 is located in the home position. FIG. 5 differs in this regard. FIG. 5 shows the same embodiment of the housing 1 of the invention as shown in FIG. 4, except that FIG. 5 shows the actuating element located in the switching position by actuation with a force F, which acts counter to the force of the spring element 8.

LIST OF REFERENCE CHARACTERS 1 housing
2 pushbutton switch
30 first ring magnet
31 second ring magnet
32 first rod magnet
32' second rod magnet
4 actuating element
50 cylinder
51 third ring magnet
52 third rod magnet
6 sensor
7 electronic unit
8 spring element
9 flux guide
10 subcomponent

The invention claimed is:

1. A field device of automation technology with a housing, wherein the housing has at least one pushbutton switch, the pushbutton switch comprising:
a first element arranged rigidly on the housing for producing a magnetic field, wherein the first element is a first ring magnet having diametral poling;
located on an outer surface of a wall of the housing, an actuating element, which is arranged movably relative to the first element, and which can assume at least a home position and a switching position;
wherein the actuating element includes a second element for influencing the magnetic field of the first element, wherein the second element is a second ring magnet having diametral poling, wherein the second ring magnet is arranged essentially concentrically and axially shiftably relative to the first ring magnet, and wherein the poling of the second ring magnet is opposite to the poling of the first ring magnet;
a sensor located in an interior of the housing for registering at least one component of a magnetic field reigning in the sensor, wherein the sensor transduces the at least one registered component of the reigning magnetic field into an electrical measurement signal; and
an electronics unit, which, based on the electrical measurement signal, determines whether the actuating element is located in the home position or in the switching position.

2. The field device as claimed in claim 1, wherein the sensor is a Hall effect sensor or a giant magnetoresistance (GMR) sensor.

3. The field device as claimed in claim 1, wherein the movement direction of the actuating element extends essentially perpendicularly to the wall of the housing.

4. The field device as claimed in claim 1, wherein a spring element is placed relative to the actuating element such that the actuating element is located in the home position in the absence of external force, and that the actuating element shifts into the switching position in the case of external force.

5. The field device as claimed in at least one of claim 1, wherein the first element and the second element are arranged relative to the actuating element such that the actuating element is held in the home position by a magnetic field reigning in the second element, and that the actuating element shifts in the case of external force into the switching position.

6. The field device as claimed in claim 1, wherein the first element is composed of a ferromagnetic material, aluminum-nickel-cobalt, neodynium-iron-boron, or hard ferrite.

7. The field device as claimed in claim 1, wherein the second element is composed of a ferromagnetic material, aluminum-nickel-cobalt, neodynium-iron-boron, or hard ferrite.

8. The field device as claimed in claim 1, wherein the sensor is surrounded by a flux guide that is composed of a non-magnetized, para- or ferromagnetic material, and
wherein the flux guide is embodied such that the magnetic fields emanating from the first element and/or from the second element toward the sensor is/are strengthened.

9. The field device as claimed in claim 1, wherein the housing is explosion protection conformly designed.

10. The field device as claimed in claim 4, wherein the first element, the actuating element, and the spring element are arranged on a subcomponent of the housing, wherein the subcomponent has a solid and releasable connection to the housing.

11. The field device as claimed in claim 1, further comprising a keypad composed of a plurality of such pushbutton switches, wherein the pushbutton switches are arranged in a row or as an array.

12. A field device, comprising:
a housing; and
a pushbutton switch, the pushbutton switch comprising:
a first magnetic element having a through-recess, the first magnetic element fixed on the housing in an area of the housing such that the through-recess is generally orthogonal to the housing in the area, wherein the first magnetic element is a first ring magnet with diametral poling;
an actuating element having a second magnetic element embodied to influence a magnetic field of the first magnetic element, the actuating element disposed at least partially in the through-recess and moveable within the through-recess between a home position and a switching position, the switching position nearer the housing than the home position, wherein the second magnetic element is a second ring magnet with diametral poling, wherein the second ring magnet is disposed generally concentrically with the first ring magnet, and wherein a poling of the second ring magnet is opposite of a poling of the first ring magnet;
a spring element disposed in the through-recess between the housing and the actuating element, the spring element embodied to push the actuating element away from the housing;

a sensor disposed within an interior of the housing proximate to the first magnetic element, the sensor embodied to register at least one component of a magnetic field of the first magnetic element and to transduce the at least one component into an electrical signal; and an electronics unit embodied at least to determine a position of the actuating element within the through-recess based on the electrical signal and to determine if the position of the actuating element is the home position or the switching position based on the electrical signal.

* * * * *